(12) United States Patent
Newlin (10) Patent No.: US 10,263,521 B2
(45) Date of Patent: Apr. 16, 2019

(54) POWER CONVERTER WITH PREDICTIVE PULSE WIDTH MODULATOR CONTROL

(71) Applicant: Silanna Asia Pte Ltd, Singapore (SG)

(72) Inventor: Trevor M. Newlin, Holly Springs, NC (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 15/877,869

(22) Filed: Jan. 23, 2018

(65) Prior Publication Data

US 2018/0152106 A1 May 31, 2018

Related U.S. Application Data

(63) Continuation of application No. 15/347,693, filed on Nov. 9, 2016, now Pat. No. 9,893,621.

(60) Provisional application No. 62/413,005, filed on Oct. 26, 2016.

(51) Int. Cl.
*H02M 3/158* (2006.01)
*H03K 7/08* (2006.01)

(52) U.S. Cl.
CPC .............. *H02M 3/158* (2013.01); *H03K 7/08* (2013.01)

(58) Field of Classification Search
CPC ......... H02M 3/156–3/158; H03K 7/08; H03M 1/08; H03M 1/38
USPC .................................. 323/271, 272, 282, 288
See application file for complete search history.

(56) References Cited

U.S. PATENT DOCUMENTS

| 5,003,454 A | 3/1991 | Bruning |
| 7,342,392 B2 | 3/2008 | Liao |
| 2010/0033152 A1* | 2/2010 | Chen .................... H02M 3/158 323/288 |
| 2010/0231183 A1* | 9/2010 | Jan ....................... H02M 3/156 323/282 |
| 2011/0068763 A1* | 3/2011 | Chang .................. H03K 7/08 323/288 |
| 2011/0316507 A1 | 12/2011 | Wang et al. |
| 2012/0049826 A1 | 3/2012 | Hsu et al. |
| 2013/0033905 A1 | 2/2013 | Lin et al. |

(Continued)

OTHER PUBLICATIONS

International Search Report dated Feb. 14, 2018 for PCT Patent Application No. PCT/IB2017/056574.

(Continued)

*Primary Examiner* — Yemane Mehari (74) *Attorney, Agent, or Firm* — The Mueller Law Office, P.C.

(57) ABSTRACT

Various methods and devices that involve control circuits for power converters are disclosed. One method comprises controlling a switch using a control signal based on a comparison signal. The switch controls a transfer of power between an input node, which receives an input, and an output node. The method comprises measuring an output of the power converter, generating an error signal based on the output, generating a periodic ramp signal with a varying period, providing the error signal to a first input terminal of a comparator, providing the ramp signal to a second input terminal of the comparator, and generating the comparison signal based on the error signal and the ramp signal using the comparator. The method comprises increasing a slope of the ramp signal in response to an increase in the input, and increasing the slope of the ramp signal in response to a decrease in the varying period.

16 Claims, 5 Drawing Sheets

(56) References Cited

U.S. PATENT DOCUMENTS

| | | | |
|---|---|---|---|
| 2014/0036556 A1 | 2/2014 | Murakami et al. | |
| 2014/0239925 A1* | 8/2014 | Tanabe | H02M 3/1582 |
| | | | 323/271 |
| 2014/0266112 A1 | 9/2014 | Cheng et al. | |
| 2015/0028924 A1* | 1/2015 | Chao | H03K 4/90 |
| | | | 327/133 |
| 2015/0029760 A1 | 1/2015 | Karlsson et al. | |
| 2015/0035503 A1 | 2/2015 | Tan et al. | |
| 2015/0070951 A1 | 3/2015 | Chen et al. | |
| 2015/0244262 A1 | 8/2015 | Ouyang | |
| 2015/0256078 A1 | 9/2015 | Tanabe | |
| 2016/0079851 A1 | 3/2016 | Babazadeh et al. | |
| 2016/0301304 A1 | 10/2016 | Zarkhin | |

OTHER PUBLICATIONS

Notice of Allowance dated Sep. 26, 2017 for U.S. Appl. No. 15/347,693.
Office Action dated Jan. 5, 2017 for U.S. Appl. No. 15/347,693.
Office Action dated Jun. 26, 2017 for U.S. Appl. No. 15/347,693.
Syed, et al., "Digital PWM controller with feed-forward compensation," Proc. IEEE Appl. Power Electron. Conf., pp. 60-66, 2004.
X. Zhang, et al., "Digital PWM/PFM Controller with Input Voltage Feed-Forward for Synchronous Buck Converters," Proc. IEEE Appl. Power Electron. Conf., pp. 523-528, 2008.

* cited by examiner

FIG. 5
500

POWER CONVERTER WITH PREDICTIVE PULSE WIDTH MODULATOR CONTROL

CROSS-REFERENCE TO RELATED APPLICATIONS

This application is a continuation of U.S. application Ser. No. 15/347,693, filed Nov. 9, 2016, which claims the benefit of U.S. Provisional Application No. 62/413,005, filed Oct. 26, 2016, both of which are incorporated by reference herein in their entirety.

BACKGROUND OF THE INVENTION

Electronic devices often need to generate multiple power regimes while only being powered by a single source. For example, a laptop computer may only have a single battery but may need to produce power regimes with different supply voltages for the various components on the laptop. Furthermore, regardless of the need for multiple power regimes, electronic devices often need to condition the power that is delivered to them from an external source. Returning to the example of a laptop, the laptop processor contains sensitive electronics and exhibits a widely varying power demand based on how hard the processor is working. Simply plugging in a DC version of the mains voltage source is not an option because the processor will not be shielded from dips or surges in the power supply and the power supply will likewise not be able to keep pace with the rapid transitions in the power drawn by the processor. The aforementioned requirements are addressed by power converters.

Power converters need to adjust rapidly to changing power demands from the loads they are regulating. This feature is becoming increasingly important as one of the main ways in which power is conserved in modern electronic devices is to switch the devices between low power operating modes for extended periods of time followed by short periodic bursts in which a large amount of power is dissipated. Power converters can be classified into two broad categories referred to as switching regulators and linear regulators. In nearly every implementation of either kind of regulator, there is a control loop that monitors the output and adjusts the amount of power flowing through the regulator between the input and the output. The control loop needs to be able to sense the output and feed the information back to the regulator fast enough to prevent overshoot or undershoot of the regulated output during a transition. The range of acceptable overshoot or undershoot and the time it takes the output to settle during the transition are set by the tolerance of the device that is being regulated.

SUMMARY OF INVENTION

In one approach a method for controlling a power converter is disclosed. The method comprises controlling a switch using a control signal. The switch controls a transfer of power between an input node of the power converter and an output node of the power converter. The input node receives an input. The method also comprises measuring an output of the power converter, generating an error signal based on the output, generating a periodic ramp signal with a varying period, providing the error signal to a first input terminal of a comparator, providing the ramp signal to a second input terminal of the comparator, and generating a comparison signal based on the error signal and the ramp signal using the comparator. The method also comprises increasing a slope of the ramp signal in response to an increase in the input, and increasing the slope of the ramp signal in response to a decrease in the varying period. The control signal is based on the comparison signal.

In one approach a method for controlling a power converter is disclosed. The method for controlling a power converter comprises controlling a switch that controls a transfer of power between an input node of the power converter and an output node of the power converter using a control signal. The input node receives an input. The method also comprises measuring an output of the power converter, generating an error signal based on the output, generating a ramp signal, providing the error signal to a first input terminal of a comparator, providing the ramp signal to a second input terminal of the comparator, and generating a comparison signal based on the error signal and the ramp signal using the comparator. The method also comprises increasing a slope of the ramp signal in response to an increase in the input, and increasing the slope of the ramp signal in response to a decrease in the output. The control signal is based on the comparison signal.

In one approach a power converter is disclosed. The power converter comprises an input node that receives an input, an output node that provides an output, and a switch with a variable impedance path. The variable impedance path is controlled by a control signal and controls a transfer of power from the input node to the output node. The power converter also comprises a driver circuit coupled to the switch, a sensing circuit coupled to the output node, an error amplifier coupled to the sensing circuit and a reference, and a periodic ramp generator circuit that generates a ramp signal with a slope and a varying period. The power converter also comprises a comparator with: (i) a comparator output communicatively coupled to the driver circuit; (ii) a first comparator input communicatively coupled to the error amplifier; and (iii) a second comparator input communicatively coupled to the periodic ramp generator circuit. The power converter also comprises a first control circuit that is configured to increase a slope of the ramp signal in response to an increase in the input, a second control circuit that is configured to increase the slope of the ramp signal in response to a decrease in the varying period, and a third control circuit that is configured to increase the slope of the ramp signal in response to a decrease in the output.

DETAILED DESCRIPTION OF THE EMBODIMENTS

Power converters often include feedback loops to maintain their outputs at a target level. For example, a power converter may receive power from a power supply in the form of a 5-volt battery, and convert that power into a regulated supply with a 3.3-volt target level for a load such as a microprocessor. The power converter will adjust itself so that the required level of power is drawn from the power supply to feed the load of the power converter while the voltage on the output of the power converter is maintained at a given level. A similar example could be given for a power converter providing a power at a target current level. The feedback loop that monitors the output of the power converter needs to operate quickly to maintain the regulated output at a desired target value in response to rapid changes in the amount of power drawn by the load. In certain approaches, the output of the power converter will also be adjustable while the power converter is operating, and the feedback loop will need to adjust quickly to the new target value.

The feedback loop of a power converter can influence the amount of power being transferred from the supply to a load by providing a control signal to a switch circuit that is coupled between the input of the power converter and the output of the power converter. By modulating the amount of time in a given period during which the switch is closed as compared to opened, the feedback loop will be able to match the amount of power that flows through the switch between the input and the output to keep the load regulated within a desired range. These kinds of power converters can be referred to as switching converters or switching regulators. The amount of time in a given period in which the switch is closed is referred to as the duty cycle of the converter.

Switching regulators often utilize a comparator to set the duty cycle of the converter. The comparator is used to compare a periodic ramp signal with what is referred to as an error signal. The error signal is on the main feedback path of the power converter and contains information regarding the relationship of the output of the power converter to a desired target output. As the error signal increases or decreases, the point at which the error signal crosses the ramp signal in any given period will change, thereby allowing the error signal to set the duty cycle of the power converter in combination with the periodic ramp signal and the comparator.

A comparator receives at least two inputs on first and second input pins and outputs a signal based on a comparison of those two inputs on an output pin. The polarity of the output signal will change when one input crosses the other input. In switching regulators, the comparator is part of the feedback loop, and hence the rate at which the output signal changes contributes to the overall time it takes for the feedback loop to respond to a change in the output of the power converter.

In general, a comparator circuit switches its output when either signal it is comparing crosses the other signal it is comparing. An ideal comparator would switch its output in the same way regardless of the common mode of the two signals. However, in actual circuit implementations how rapidly one signal is changing as it crosses the other, and the relative point at which that cross over occurs has an impact on how fast the comparator output switches. A power converter that takes in a supply at a voltage of 5V, regulates an output at 1V, and has a 10 MHz switching period with a 100 mV ramp, can be used to illustrate this point. Under these conditions, the power converter could use a 20% duty cycle and would therefore switch after rising 20 mV (i.e., 20% of a 100 mV ramp). A reasonable implementation for a comparator in this situation may transition on the order of 10 ns. Using the same external conditions, but increasing the ramp amplitude to 400 mV, the converter would switch at 80 mV and the ramp would be increasing at a much faster rate at the point it crosses the error voltage. The same comparator in this situation may transition on the order of 5 ns. In addition, the larger ramp approach is better protected from pulse skipping or half frequency operation.

Returning to the example of a switching regulator, the slope of the ramp at the point at which the error voltage crosses the ramp voltage is affected by numerous factors. However, approaches disclosed herein allow a power converter to maintain the slope of the ramp and the cross over point of the comparator above a target level regardless of any changes to these factors. The control loop can be designed such that the operating point for the comparator coincides with the optimal range for the comparator in terms of maximizing the speed at which the output of the comparator changes. Effectively, the characteristics of the control loop can be altered so that the information regarding the required duty cycle is allowed to flow through the loop while the operating point of the power converter is kept in its optimal range.

Figure 1:
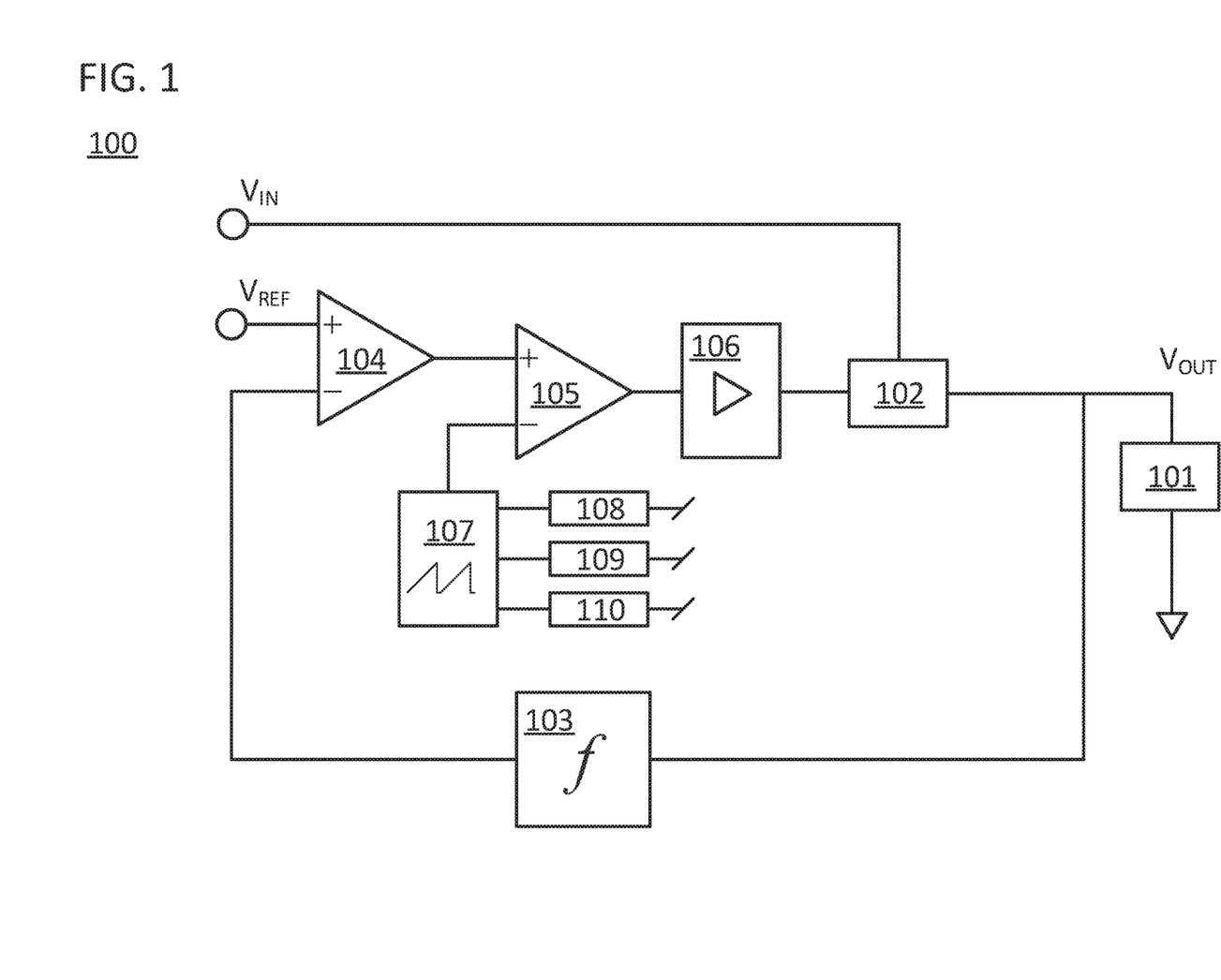
FIG. 1 is a block diagram of a power converter with a ramp signal generator having a variable slope that is in accordance with embodiments disclosed herein.

Power converters that can be designed to exhibit the aforementioned feature can comprise various topologies. For explanatory purposes, FIG. 1 is a block diagram of a power converter 100 with an input node receiving an input and an output node providing an output. In this example, the specific input can be conceptualized as an input voltage $V_{IN}$ provided by a power supply such as a battery, a mains power supply, or another power converter, while the output can be conceptualized as an output voltage $V_{OUT}$ provided to a load 101 such as an ASIC, microprocessor, MEMS device, or other device that consumes power. Power converter 100 includes a switching circuit 102 that controls a transfer of power between the input and the output of the power converter. The switching circuit 102 is controlled by a control signal generated by a feedback loop. Switching circuit 102 is coupled between the input node of the power converter and the output node of the power converter.

The example topology of FIG. 1 could be that of a buck converter, but the teachings herein are more broadly applicable to buck, boost, buck-boost, boost-buck, or transformer-based converters. Also, the example shows the input and output as voltages, but current signals could likewise be conceptualized as the regulated output and the input of the power converter. In FIG. 1, the switching circuit 102 is coupled between the input and the output. The switching circuit could comprise an individual active device such as a field effect transistor (FET), bipolar junction transistor (BJT), pin diode, or IGBT. The switching circuit could include a variable impedance path coupled between the input and the output. The state of the variable impedance path could be set by the feedback loop.

Power converters that are designed in accordance with this disclosure may include a feedback loop. In the example of FIG. 1, power converter 100 includes a feedback loop. The feedback loop of power converter 100 includes sensing circuit 103, error amplifier 104, comparator 105, and driver circuit 106. The error amplifier 104 receives a reference voltage $V_{REF}$ and generates an error signal based on the relative value of $V_{REF}$ as compared to the voltage provided by sensing circuit 103. The error amplifier could be coupled to sensing circuit 103 and a reference. Sensing circuit 103 can be as simple as a voltage divider connected to $V_{OUT}$ and ground with an input coupled to the output node of the power converter at $V_{OUT}$. In other implementations, a sensing circuit connected to the output of the power converter can provided a signal that is indicative of other signals in the power converter such as a current through an output filter, a current through the switching circuit, or any other value, while $V_{REF}$ is commensurately adjusted to match a target value for that parameter.

The comparator of a switching regulator can compare the error voltage with a ramp voltage to set the duty cycle of the power converter's switching circuit. The comparator output could be communicatively coupled to a driver circuit of the power converter. The comparator could also have two inputs with a first comparator input communicatively coupled to the error amplifier and a second comparator input communicatively coupled to a ramp signal generator. In power converter 100, comparator 105 includes a first input and a second input and provides an output to driver circuit 106 which in turn modulates the time that the switching circuit 102 is closed. Comparator 105 receives the error voltage on one input and the output of a ramp generator circuit 107 on a second input. As illustrated, ramp generator circuit 107 can include multiple control inputs. Ramp generator circuit 107 can be a periodic ramp signal generator that generates a ramp signal with a slope and a varying period. The slope of the ramp could also be variable.

The ramp generator of a switching regulator can adjust the characteristics of its generated ramp based on signals that describe the current state of the ramp generator. In power converter 100, ramp generator circuit 107 can respond to three different control circuits 108, 109, and 110 providing signals to these control inputs. The control circuits can each individually receive information regarding the state of the power converter and provide a control signal based on that information to the ramp generator. As specific examples, control circuits 108, 109, and 110 could receive information regarding the input of the power converter 100, the output of the power converter 100, and a desired period of the ramp signal respectively. Ramp generator circuit 107 can respond to the three different control circuits in several ways. For example, ramp generator circuit 107 can respond by altering a slope of the periodic ramp signal. The manner in which the slope is altered will be described in more detail below, but in general, the slope will be altered to maintain the speed of the comparator at a target level.

Ramp generators used with the power converters disclosed herein can exhibit various features. For example, the ramp generators could be controlled by an oscillator. The period of the oscillator could be used to set the period of the ramp signal. The ramp signal could continue to rise throughout its period, or it could itself exhibit a duty cycle and only be rising for a fraction of its overall period. The period of the ramp signal could be adjusted while the power converter is in operation. The duty cycle of the ramp signal could likewise be adjusted. The ramp can be produced by a reactive passive component responding to a fixed voltage or current signal. For example, the ramp could be produced by a capacitor being charged in response to a fixed current. Ex ante knowledge of the capacitance and current magnitude would allow a designer to set the slope of the ramp. The ramp could return to a low voltage by rapidly discharging the capacitor. Alternatively, the ramp could return to a low level by disconnecting the node containing the ramp signal from the charging circuit. The ramp generators can receive control signals from at least one of the control circuits. The control circuits could influence the slope of the ramp signal by adjusting the size of a reactive component or adjusting the magnitude of the charging current. For example, a capacitor being charged by a current could set the slope of the ramp and the capacitor or current could be varied to alter the slope of the ramp. The control circuits could adjust the slope based on at least two of the input to the comparator, the output of the comparator, or a desired period of the ramp signal itself.

Figure 2:
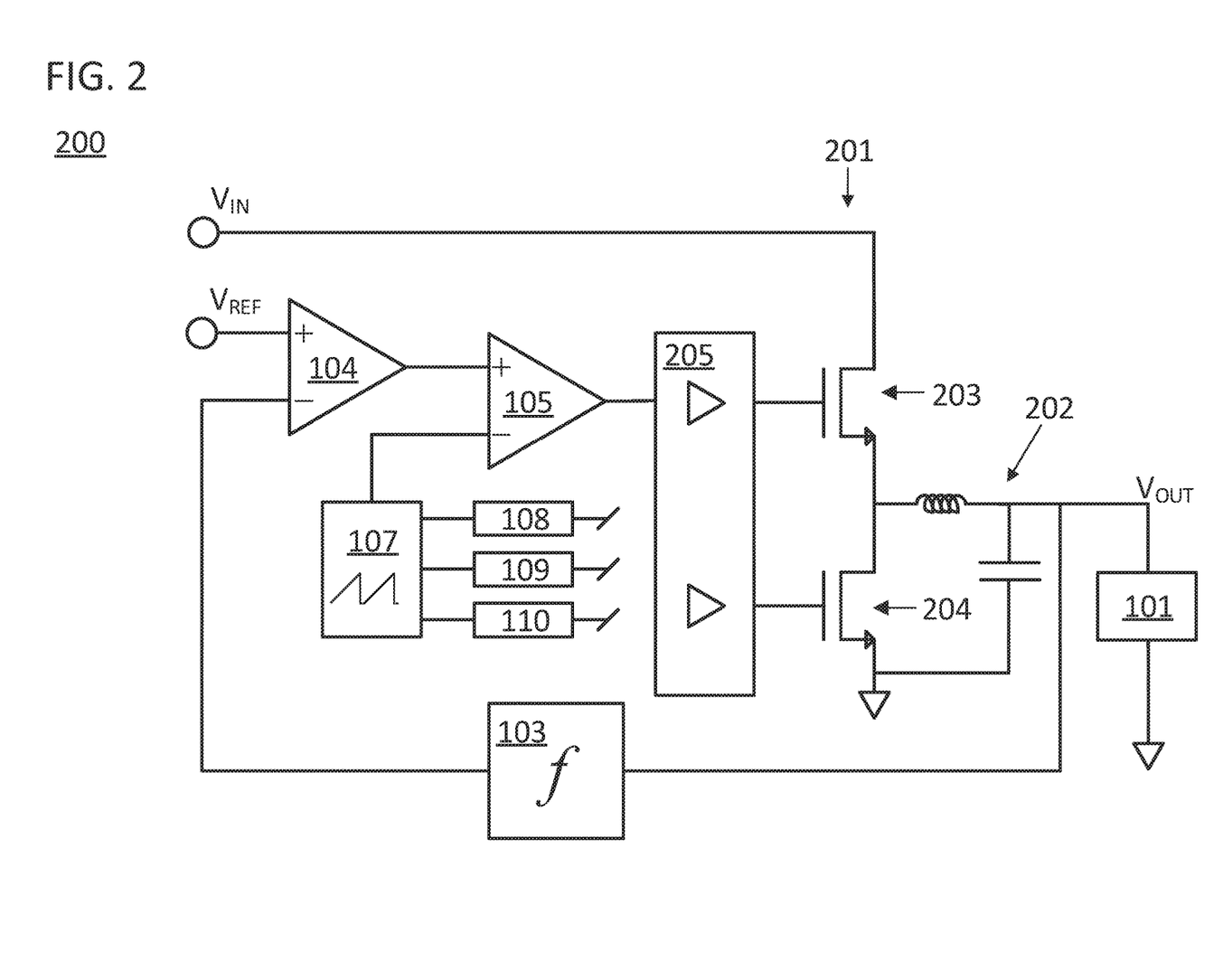
FIG. 2 is a block diagram of a power converter with FET power switches and a ramp signal generator having a variable slope that is in accordance with embodiments disclosed herein.

FIG. 2 illustrates a power converter 200 with a switching circuit 201 and output filter 202 configured to allow power converter 200 to operate as a buck or step-down converter. Power converter 200 will therefore be able to produce a regulated voltage at the output $V_{OUT}$ that is lower than the input voltage provided at the input $V_{IN}$. The input could be an input voltage received from a power supply such as a battery or mains power supply. The output could be a regulated voltage provided to a processor or other load with variable power demands. The control loop of power converter 200 is similar to that of power converter 100 except that the control loop in power converter 200 is limited to a voltage mode control loop. In power converter 200, the error signal produced by error amplifier 104 is an error voltage.

The switching circuit 201 of power converter 200 includes two n-type FETs 203 and 204 to serve as the switches for switch circuit 201. However, the switches could both be p-type FETs or could be of differing polarity. The FETs include gates and variable impedance paths responsive to a control signal applied to those gates. Switching circuit 201 is coupled in between the input node of the power converter and the output node of the power converter in that FET 203 provides a variable impedance path that serves to transfer power from the input of the power converter to the output of the power converter. FET 203 can be referred to as the control FET of power converter 200. FET 204 can be referred to as the synchronous rectifier FET or synch FET of power converter 200. As illustrated, the gates of FET 203 and FET 204 receive control signals from a driver circuit 205. The current through FET or the voltage across either FET could be sensed to provide information to the control loop.

Output filter 202 includes a capacitor and an inductor. The action of this combined circuit will be to smooth variation in $V_{OUT}$ while the switching circuit or load is changing its state. In this particular power converter illustrated, the output of output filter 202 is sensed by sensing circuit 103. However, in other approaches, the current through the inductor of the capacitor could be sensed in combination or in the alternative to provide information to the control loop.

Driver circuit 205 is coupled to FET 203 and FET 204 and provides control signals to the FETs to alter the state of a variable impedance path between the source and drain of the FETs. Driver circuit 205 is in turn controlled by the output of comparator 105. Additional control signals such as blanking signals that prevent both switches (FETs 203 and 204) from being on at the same time, or tristate signals that automatically turn both switches off in the event of a fault condition, could also be applied to driver circuit 205.

Figure 3:
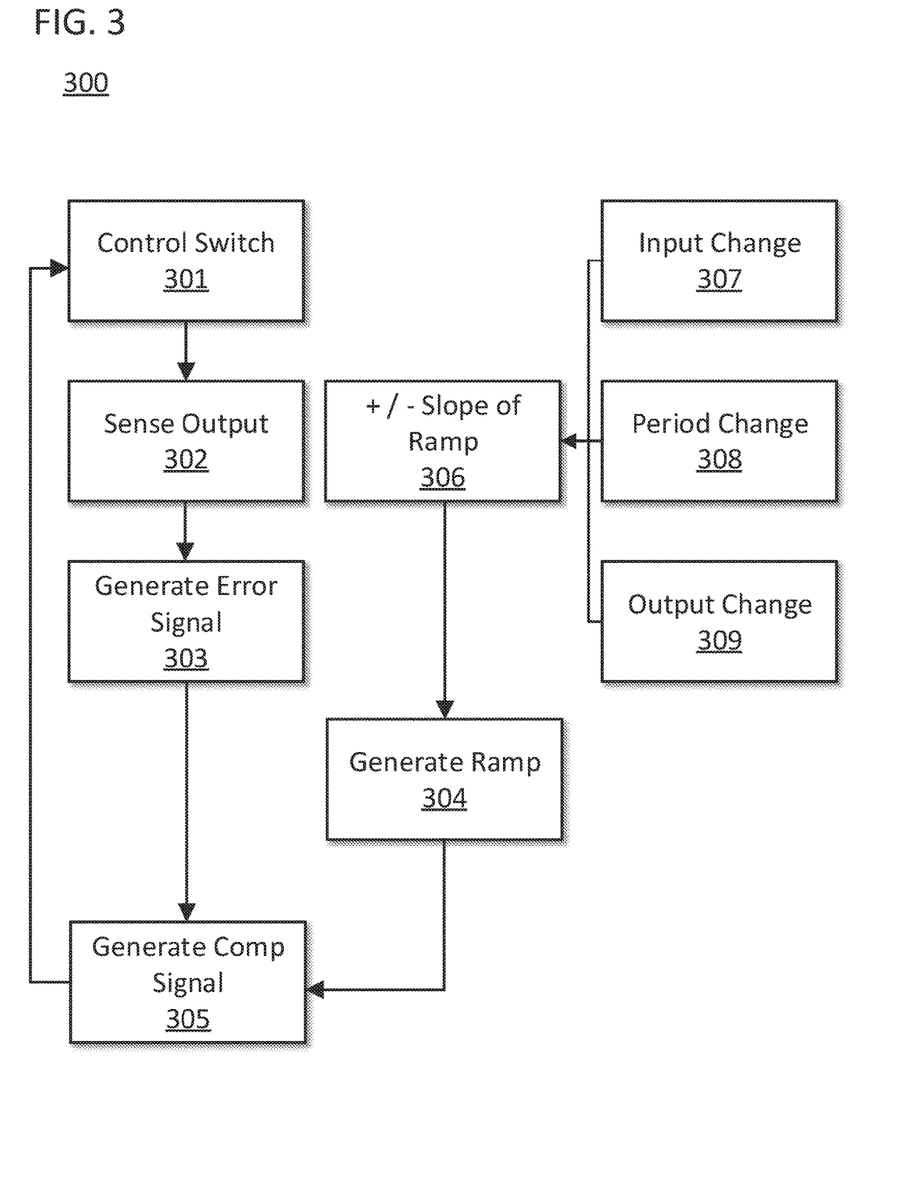
FIG. 3 is a flow chart of a set of methods for controlling a power converter that is in accordance with embodiments disclosed herein.

FIG. 3 shows a flow chart 300 of a set of methods for controlling a power converter. The methods include a step 301 of controlling a switch using a control signal. The switch controls a transfer of power between an input node of the power converter and an output node of the power converter. The input node receives an input. With reference to FIG. 2, the input could be a voltage from a power supply on node $V_{IN}$ and the switch could be FET 203. In this approach, controlling the switch in step 301 could comprise applying a control signal to the gate. The control signal could be a comparison signal generated in step 305 below. With reference to FIG. 2, the control signal could be the signal provided from the output of comparator 105 to drive circuit 205.

Flow chart 300 also includes a set of steps that involve the transfer of information back through the control loop of the power converter. These steps could generate the control signal that is utilized in step 301. The steps could include steps 302-305 as described immediately below.

In step 302, the output of a power converter is measured. With reference to FIG. 2, this step could be a continuous process executed by a sensing circuit 103 detecting the voltage on the output of the power converter at $V_{OUT}$. Alternatively, this step could involve sensing an output current, or indirectly sensing either value via the measurement of signals and other voltages that are correlated with the power converter output.

In step 303, an error signal is generated based on the output. With reference to FIG. 2, this step could involve error amplifier 104 comparing a voltage signal from sensing circuit 103 with a reference voltage $V_{REF}$. Alternatively, this step could involve an evaluation of any feedback signal regarding the state of the power converter. This evaluation could include the use of a reference signal such as an externally applied reference signal or an internally generated reference voltage. The reference voltage could be generated by a voltage divider with the power supply of the power converter serving as an input.

In step 304, a periodic ramp signal is generated with a varying period. With reference to FIG. 2, this step could involve ramp generator circuit 107 producing a ramp signal with a period that can be increased or decreased by one or more control circuits such as control circuits 108, 109, and 110. Step 304 could also include generating an oscillator signal using an oscillator. The oscillator signal could have a variable oscillator frequency. The period of the ramp signal could be varied by varying the frequency of the variable oscillator. Step 304 could also include timing a start of the ramp of the periodic ramp signal using the oscillator signal. In certain approaches, the ramp will be increasing from its minimum value at the start of each period of the oscillator signal.

In step 305, a comparison signal is generated. The comparison signal can be generated based on the error signal generated in step 303 and the ramp signal generated in step 304. A comparator could receive the error signal on a first input terminal and the ramp signal on a second input terminal. With reference to FIG. 2, this step could involve comparator 105 receiving an error signal from error amplifier 104 and a ramp signal from ramp generator circuit 107. Comparator 105 could generate the comparison signal based on a comparison of those two signals.

Steps 301-305 described above are illustrated in linear fashion to facilitate a description of the comparator's control loop. However, each step in the control loop may be simultaneously executed when the loop is serving to control the comparator as information is continually transferred via negative feedback to regulate the output of the comparator within a targeted degree of variation.

Steps 306-309 are drawn to modifications to the slope of the ramp signal generated in step 304 above. As such, these steps are illustrated as separate from the steps that describe the behavior of the control loop because they may be executed by the controller at any time to modify the instantaneous behavior of the control loop. In step 306, a control circuit increases or decreases a slope of the ramp signal that is generated in step 304. This step can be conducted by one or more control circuits. With reference to FIG. 2, the control circuits could include one or more of control circuits 108, 109, and 110. The control circuits can increase or decrease the slope of the ramp signal in response to varying signals. For example, the control circuits could receive an external control signal applied from a control outside of the power converter. As another example, the control signal could sense individual current or voltages within the power converter to adjust the ramp of the ramp signal based on the state of the power converter.

In step 307, a change in the input is detected. In step 306, the slope of the ramp could be increased or decreased in response to that input. In certain approaches, the combined action of steps 307 and 306 could involve increasing a slope of the ramp signal in response to an increase in the input or decreasing a slope of the ramp signal in response to a decrease in the input. The direction in which the slop is adjusted could be selected in order to preserve the switch over point of a comparator in the control loop of the power converter. With reference to FIG. 2, the comparator could be PWM comparator 105. The first control circuit 108 could be configured to increase a slope of the ramp signal in response to an increase in the input and decrease a slope of the ramp signal in response to a decrease in the input. The state of the input could be determined via an analog sensing circuit that could detect the input current or voltage. As such, the input to first control circuit 108 could be connected directly to node $V_{IN}$. However, the input could also be connected to an alternative source for information regarding the status of $V_{IN}$ such as an external control circuit or a monitor integrated with the supply itself. The sensing circuit could convert the sensed signal into digital information for use by the control circuit that altered the ramp, or the ramp generator could be configured to adjust the ramp based directly on the analog form of the sensed signal.

In step 308, a change in the period of the ramp signal generator is detected. In certain switching power converters, the duty cycle of the control signal applied to the power switches changes during regular operation, and the frequency of the control signal also changes. The change in frequency can be conducted by a control circuit that is external to the main control loop or integral to the control loop. In other words, the change in frequency could be based on information gleaned regarding the state of the output or could be based on some other source of information. In step 306, the slope of the ramp could be increased or decreased in response to the change in the period.

In certain approaches, the combined action of steps 308 and 306 could involve increasing a slope of the ramp signal in response to a decrease in the period or decreasing a slope of the ramp signal in response to an increase in the period. The direction in which the slope is adjusted could be selected in order to preserve the switch over point of a comparator in the control loop of the power converter. With reference to FIG. 2, the comparator could be PWM comparator 105. The second control circuit 109 could be configured to increase a slope of the ramp signal in response to a decrease in the period and decrease a slope of the ramp signal in response to an increase in the period. The period of the ramp generator signal could be determined via an analog sensing circuit that could detect the period of the ramp or an oscillator circuit, if one were used to control the period of the ramp. The period of the ramp could also be indirectly determined by information from a control circuit that was actively setting the frequency of the ramp generator circuit. For example, a digital control circuit that was setting the frequency of the ramp generator circuit by providing a digital code could provide the same digital code to the ramp generator circuit for purposes of controlling the slope of the ramp produced by the ramp generator circuit.

In step 309, a change in the output of the power converter is detected. In certain switching power converters, the output of the power converter can be set to different target levels during regular operation. This form of adjustment is in addition to the natural variation of the output based on the lag between the power converter adjusting itself and a change in the power demanded by the load. For example, the power converter might need to regulate a load at 3.5 volts in low temperature conditions and 3.3 volts at room temperature conditions. As such, a control circuit could alter the target voltage of the power converter when the temperature changed to match these targets. With reference to FIG. 2, an example of how this could be done is an adjustment to the reference voltage $V_{REF}$. In step 306, the slope of the ramp could be increased or decreased in response to the change in the output.

In certain approaches, the combined action of steps 308 and 306 could involve increasing a slope of the ramp signal in response to a decrease in the output or decreasing a slope of the ramp signal in response to an increase in the output. The direction in which the slope is adjusted could be selected in order to preserve the switch over point of a comparator in the control loop of the power converter. With reference to FIG. 2, the comparator could be comparator 105. The third control circuit 110 could be configured to increase a slope of the ramp signal in response to a decrease in the output and decrease a slope of the ramp signal in response to an increase in the output. The output of the power converter could be determined via an analog sensing circuit that could detect the output of the power converter. Alternatively, the output of the power converter could be indirectly determined by information from a control circuit that was actively setting the output of the power converter to a desired level. For example, a digital control circuit that was setting the output of the power converter by providing a digital code to elements of the control loop could provide the same digital code to the ramp generator circuit for purposes of controlling the slope of the ramp produced by the ramp generator circuit.

Power converters such as power converter 100 could be configured to execute each of steps 307, 308, and 309. These power converters could also be configured to execute two or more of these steps during regular operation. The steps could be conducted while the power converter was regulating its output or during a configuration mode. One or more of steps 307, 308, and 309 could all be conducted simultaneously. In these approaches, step 306 could involve reconciling countervailing changes from the three different steps. With reference to FIG. 2, ramp generator circuit 107 could include logic, analog controls, or both that would reconcile countervailing changes received from two or more of control circuits 108, 109, and 110. The control circuits could cause the ramp of the ramp signal produced by ramp generator circuit 107 to vary proportional with the signal they operated upon. A scaling factor could be selected by a designer. The scaling factor could be embedded in the control circuit or within the ramp generator circuit itself. For example, a capacitor used to set the rise time of the ramp generator could double in size in response to a doubling of an input from control circuit 108 but only decrease by one quarter in size in response to a halving of an input from control circuit 109. The scaling factor for the combination of each control circuit with the ramp generator could be tuned for the particular input the control circuit received.

The slope of the ramp signal can be adjusted to preserve the crossover point of the inputs of a comparator in the control loop of the power converter. In particular approaches, the slope of the ramp signal will be adjusted to keep the crossover point of the error signal and the ramp signal above a certain minimum to provide the comparator with sufficient overdrive to meet a desired speed constraint such as the cross over point exceeding 300 millivolts to meet a minimum comparator output settling time of 5 nanoseconds with a comparator supply current of less than 12 uA. In other approaches, increasing and decreasing the slope of the ramp signal serves to maintain a crossover point of the error signal and the ramp signal within a range of a target crossover point despite variations in the output of the power converter, input of the power converter, and varying period of the switching signal. For example, the increasing and decreasing of the slope of the ramp could preserve the crossover point to within 100 millivolts of a target cross over point despite variations of 0.5-5 V in the output, 3.3-24 V in the input, and 500 kHz-8 MHz in the period with less than 20 uA of supply current.

A power converter may be initially operating in a first quiescent state with error signal $V_{ERR1}$ and a duty cycle $D_1$. At a given time, the power converter may experience a change in its state when the input of the power converter increases. As a result, the duty cycle of the power converter will need to contract as a larger amount of power will flow through the power converter in a given period of time with a larger voltage supply. However, the slope of the ramp signal could also be increased, and the same duty cycle point can be reached for the power converter to operate correctly while the crossover point of the error signal and ramp signal is preserved.

A power converter may be initially operating in a first quiescent state with error signal $V_{ERR1}$, a duty cycle $D_1$, and a period $T_1$. The switching period can be the same thing as the period of the ramp signal, and both can be equal to $T_1$. At a given time, the power converter may experience a change in its state when the switching period of the power converter decreases to $T_2$ from $T_1$. This would be caused by, for example, an increase in the switching frequency of the converter. As a result, the duty cycle of the power converter will need to be preserved despite the decrease in the period. This adjustment is implemented by the control loop via a decrease in the error signal. However, if the slope of the ramp signal is concomitantly increased, the same duty cycle point can be reached for the power converter to operate correctly while the crossover point of the error signal and ramp signal are preserved and the slope of the ramp is increased.

The approaches disclosed herein can also be used in combination with variations in the output of the power converter. With reference to variations in the input voltage, one difference is that the relationship between the variation and the required commensurate change in the slope of the ramp signal is inverted. The shift in the error signal could be caused by a decrease in the target output voltage of the power converter as opposed to an increase in the input voltage of the power converter. However, aside from a change in the scaling factor and other factors, the change in the slope of the ramp signal can still preserve the crossover point of the comparator while allowing for an increase in the slope of the ramp signal. In addition, the target output voltage is more likely to be a signal for which a digital code is available to the power converter such that in certain approaches adjusting the slope for changes in the output can be based on the application of a digital code representative of changes in the output while changes in the input are monitored using an analog sensing circuit.

A power converter can utilize one, two, or all three forms of variation described in the previous paragraphs. In the case of two or three forms of variation used in combination, a change in one operating point variable may counteract a change in another operating point variable and leave the ramp slope unchanged. For example, in a situation where the ramp slope varied with both the input and the output of the power converter simultaneously, if the input and output increased proportionally, the ramp slope would remain unchanged. The variation of the different operating point variables can combine to influence the slope of the ramp according to a shared scaling factor. For example, in a situation in which the ramp slope was altered by changing the charge current for a capacitor in the ramp signal generator circuit, the current could be $I_{charge} = K_1 \times V_{IN} \times f / V_{OUT}$, where $K_1$ was the shared scaling factor, $V_{IN}$ was an input voltage to the converter, $V_{OUT}$ was an output voltage of the converter, and f was the switching frequency of the converter.

Figure 4:
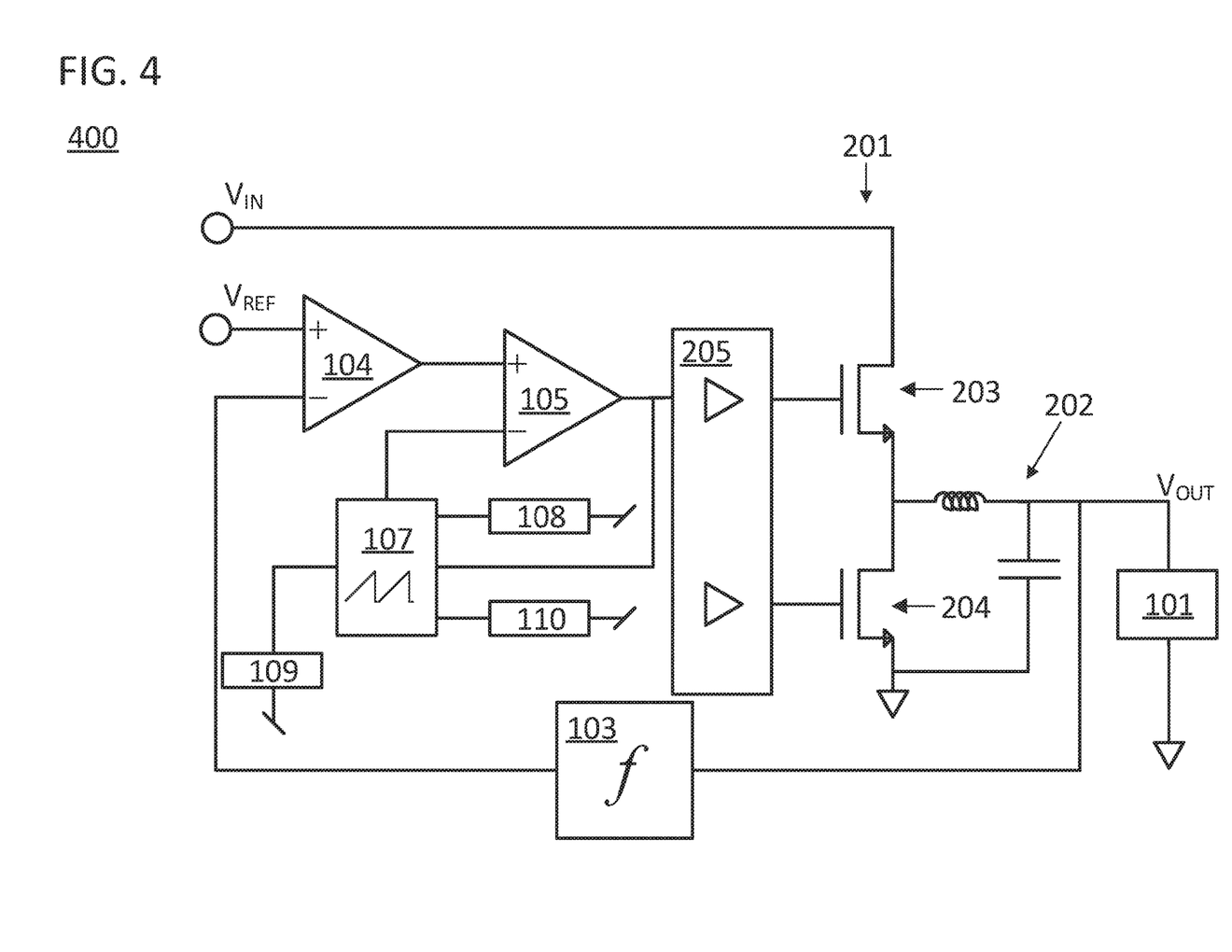
FIG. 4 is a block diagram of a power converter with FET power switches and a ramp signal generator having a variable slope and that receives a control input based on the output of the power converter control loop comparator which is in accordance with embodiments disclosed herein.

Certain approaches disclosed above can be used in combination with the control loop architecture illustrated by power converter 400 in FIG. 4. In power converter 400, the output of the comparator 105 is fed back to ramp signal generator circuit 107. The purpose of this feedback is to allow the ramp to shutoff after the comparator has tripped for a given switching cycle of the power converter. Although a direct connection is shown, the signal could be fed back from further down the control loop such as internal to driver circuit 205. In certain approaches, the signal will be fed back from the output of a latch that is used to latch the comparator signal after it trips. The latch could be in driver circuit 205. In these approaches, the step 304 of generating the ramp could include timing an end of the ramp of the periodic signal using the comparison signal generated in step 305. For example, when the comparison signal indicates a cross over point has been reached in a comparison of the ramp signal to the error signal, the ramp signal could return to a minimum value instead of continuing to increase. Since the ramp signal has effectively served its purpose at the time the comparator switches, in some approaches there is no reason to continue ramping the ramp signal, and the ramp signal generator circuit can be turned off to preserve power.

Figure 5:
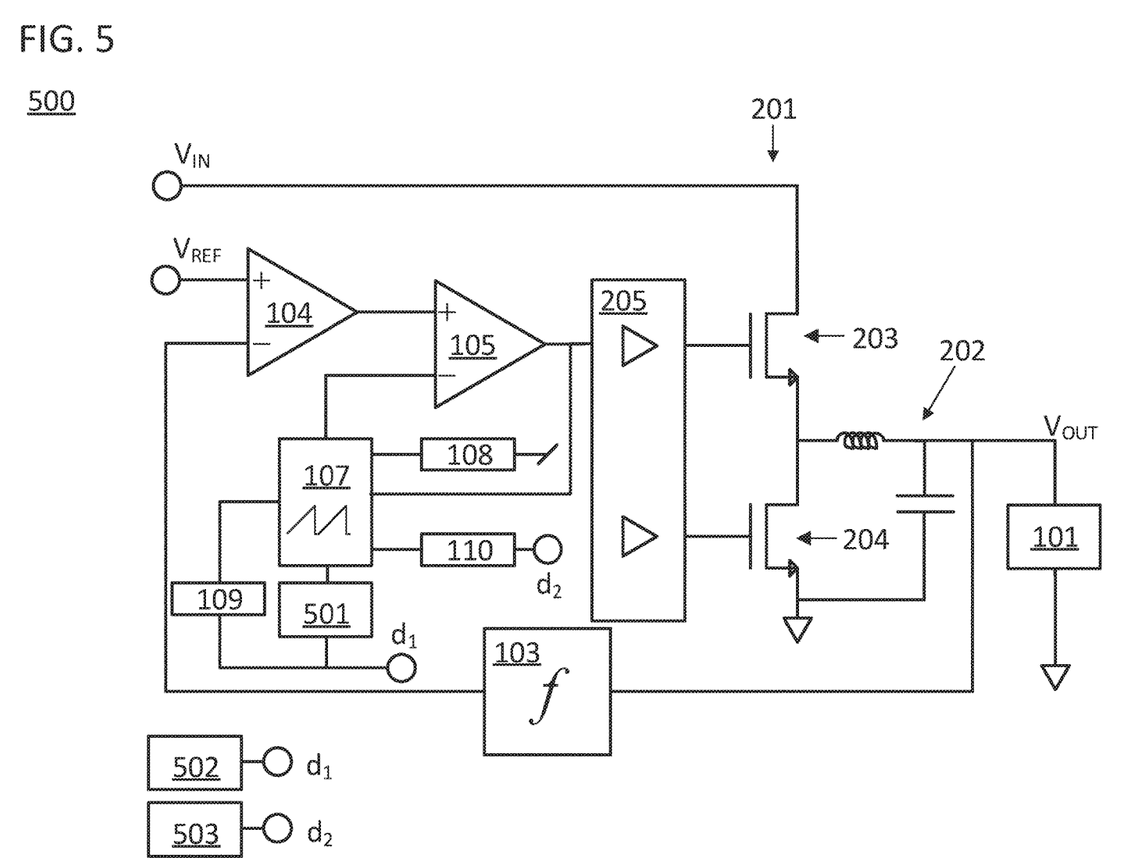
FIG. 5 is a block diagram of a power converter with FET power switches, a ramp signal generator having a variable slope, and an oscillator with a variable period that is in accordance with embodiments disclosed herein.

Certain approaches disclosed above can be used in combination with the control loop architecture illustrated by power converter 500 in FIG. 5. The power converter of FIG. 5 includes an oscillator 501. Oscillator 501 can have a variable period and can be used to set the period of the ramp signal generated by ramp generator circuit 107. The start of the ramp signal can be set by the oscillator. In certain approaches, the start of a period of the oscillator can cause the ramp signal to begin rising from a minimum value. As with power converter 400, the ramp generator circuit 107 of FIG. 5 includes a connection to the output of power converter 105. As such, the start of the ramp signal in power converter 500 can be set by oscillator 501 while the end of the ramp signal can be set by the output of comparator 105.

A power converter can include a control circuit to respond to a digital code and control an output of the power converter. In combination or in the alternative, a power converter can include a control circuit to respond to a digital code and control a switching frequency of the power converter. As illustrated, power converter 500 includes a fourth control circuit 502 and a fifth control circuit 503. Fourth control circuit 502 responds to a first digital code $d_1$ and controls the switching frequency of the power converter based on that digital code. Digital code $d_1$ is provided to oscillator 501 and alters the oscillation frequency of oscillator 501. Digital code $d_1$ is likewise provided to the second control circuit 109 to cause an adjustment to the slope of the ramp signal generated by ramp generator circuit 107 as described above. Fifth control circuit 503 responds to a second digital code $d_2$ and controls a target output voltage on node $V_{OUT}$ based on that digital code. Digital code $d_2$ is provided to the third control circuit 110 to cause an adjustment to the slope of the ramp generated by ramp generator circuit 107 as described above.

While the specification has been described in detail with respect to specific embodiments of the invention, it will be appreciated that those skilled in the art, upon attaining an understanding of the foregoing, may readily conceive of alterations to, variations of, and equivalents to these embodiments. All of the circuitry discussed with reference to FIGS. 1, 2, 4, and 5 could be integrated on a single monolithic substrate include the logic required for any control circuits and the power FETs in the power converter switching circuit. Although examples in the disclosure were directed to switching power converters that provided a fixed voltage to a regulated regime, the same approaches can be applied to power converters that provide a fixed current to a regulated regime. Although examples in the disclosure were directed to switching power converters in buck configuration, similar approaches can be applied to boost converters, buck-boost, boost-buck, or transformer-based converters. In the provided examples, the polarity of reference, ground, and signal carrying voltages can be switched in whole or in part to achieve similar results. For example, a logic low and logic high could be switched provided an additional inverter was added to the system or provided the entire system switched. Furthermore, although examples in the disclosure were directed to switching converters the approaches disclosed herein apply to any power converter scheme that utilizes comparators and includes a control loop. These and other modifications and variations to the present invention may be practiced by those skilled in the art, without departing from the scope of the present invention, which is more particularly set forth in the appended claims.

What is claimed is:

1. A power converter comprising:
   an input node to receive an input voltage;
   an output node to provide an output voltage;
   a first switch with a switch control input and a variable impedance path, the variable impedance path being configured to be controlled by a control signal received at the switch control input, and the variable impedance path being configured to control a transfer of power from the input node to the output node;
   a sensing circuit coupled to the output node;
   an error amplifier with a first error amplifier input coupled to the sensing circuit and a second error amplifier input coupled to a reference voltage, the error amplifier being configured to generate an error signal based on a signal received at the error amplifier from the sensing circuit;
   a periodic ramp generator circuit to generate a ramp signal with a slope and a varying period;
   a comparator with: (i) a first comparator input communicatively coupled to an output of the error amplifier to receive the error signal, (ii) a second comparator input communicatively coupled to the periodic ramp generator circuit to receive the ramp signal, and (iii) a comparator output to provide a comparison signal;

a driver circuit with: (i) an input communicatively coupled to the comparator output to receive the comparison signal, and (ii) an output coupled to the switch control input;
a first control circuit communicatively coupled to the periodic ramp generator circuit and that is configured to change a slope of the ramp signal in response to a change in the input voltage;
a second control circuit communicatively coupled to the periodic ramp generator circuit and that is configured to change the slope of the ramp signal in response to a change in the varying period of the ramp signal; and
a third control circuit communicatively coupled to the periodic ramp generator circuit and that is configured to change the slope of the ramp signal in response to a change in the output voltage.

2. The power converter of claim 1, wherein:
the first control circuit is configured to change the slope of the ramp signal by increasing the slope of the ramp signal in response to an increase in the input voltage;
the second control circuit is configured to change the slope of the ramp signal by increasing the slope of the ramp signal in response to a decrease in the varying period; and
the third control circuit is configured to change the slope of the ramp signal by increasing the slope of the ramp signal in response to a decrease in the output voltage.

3. The power converter of claim 2, wherein:
the first control circuit is configured to change the slope of the ramp signal by decreasing the slope of the ramp signal in response to a decrease in the input voltage;
the second control circuit is configured to change the slope of the ramp signal by decreasing the slope of the ramp signal in response to an increase in the varying period; and
the third control circuit is configured to change the slope of the ramp signal by decreasing the slope of the ramp signal in response to an increase in the output voltage.

4. The power converter of claim 3, wherein:
the first control circuit is configured to change the slope of the ramp signal in accordance with a first fixed scaling factor;
the second control circuit is configured to change the slope of the ramp signal in accordance with a second fixed scaling factor; and
the third control circuit is configured to change the slope of the ramp signal in accordance with a third fixed scaling factor.

5. The power converter of claim 4, wherein:
increasing and decreasing the slope of the ramp signal serve to maintain a crossover point of the error signal and the ramp signal above 300 millivolts.

6. The power converter of claim 4, wherein:
increasing and decreasing the slope of the ramp signal serve to maintain a crossover point of the error signal and the ramp signal within 100 millivolts of a target cross over point with less than 20 uA of current consumed by a control circuit of the power converter and despite variations of: (i) 0.5-5V in the output voltage; (ii) 3.3-24V in the input voltage; and (iii) 500 kHz-8 MHz in the varying period.

7. The power converter of claim 3, wherein:
the first control circuit is configured to increase the slope of the ramp signal in response to an increase in the input voltage in accordance with a first fixed scaling factor;
the first control circuit is configured to decrease the slope of the ramp signal in response to a decrease in the input voltage in accordance with a second fixed scaling factor;
the second control circuit is configured to increase the slope of the ramp signal in response to a decrease in the varying period in accordance with a third fixed scaling factor;
the second control circuit is configured to decrease the slope of the ramp signal in response to an increase in the varying period in accordance with a fourth fixed scaling factor;
the third control circuit is configured to increase the slope of the ramp signal in response to a decrease in the output voltage in accordance with a fifth fixed scaling factor; and
the third control circuit is configured to decrease the slope of the ramp signal in response to an increase in the output voltage in accordance with a sixth fixed scaling factor.

8. The power converter of claim 1, wherein:
the comparator is configured to generate the comparison signal based on the error signal and the ramp signal.

9. The power converter of claim 8, wherein:
the error signal is an error voltage.

10. The power converter of claim 1, further comprising:
an output filter coupled to the output node;
a second switch coupled to the first switch and a ground voltage;
wherein the first switch and the second switch are field effect transistors;
wherein the input voltage is received from a power supply; and
wherein the output voltage is a regulated output voltage provided to a load.

11. The power converter of claim 1, further comprising:
an oscillator with an oscillator control input to vary a period of oscillation of the oscillator;
wherein a start of the ramp signal is set by the oscillator; and
wherein an end of the ramp signal is set by the comparator.

12. The power converter of claim 11, wherein:
the ramp signal rises for only a fraction of the period of oscillation.

13. The power converter of claim 11, further comprising:
a fourth control circuit configured to respond to a first digital code and to control the oscillator control input; and
a fifth control circuit configured to respond to a second digital code and to control the output voltage on the output node;
wherein the second control circuit is configured to respond to the first digital code; and
wherein the third control circuit is configured to respond to the second digital code.

14. The power converter of claim 1 wherein:
the comparator output of the comparator is communicatively coupled to an input of the periodic ramp generator circuit; and
the periodic ramp generator circuit is configured to return the ramp signal to a minimum value upon determining that a cross over point of the comparison signal has been reached.

15. The power converter of claim 1, wherein:
the first switch is a field effect transistor (FET);
a gate of the FET is the switch control input; and the variable impedance path is between a source node of the FET and a drain node of the FET.

16. The power converter of claim 15, wherein:
the power converter is integrated on a single monolithic substrate.

\* \* \* \* \*